(12) United States Patent
Shin et al.

(10) Patent No.: US 8,762,900 B2
(45) Date of Patent: Jun. 24, 2014

(54) METHOD FOR PROXIMITY CORRECTION

(75) Inventors: Jaw-Jung Shin, Hsinchu (TW); Shy-Jay Lin, Jhudong Township, Hsinchu County (TW); Hua-Tai Lin, Hsinchu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/534,765

(22) Filed: Jun. 27, 2012

(65) Prior Publication Data
US 2014/0007023 A1    Jan. 2, 2014

(51) Int. Cl.
G06F 17/50    (2006.01)

(52) U.S. Cl.
USPC .............. 716/53; 716/55; 716/110; 716/118; 716/119

(58) Field of Classification Search
USPC .......................................... 716/53
See application file for complete search history.

(56) References Cited

U.S. PATENT DOCUMENTS

| | | | |
|---|---|---|---|
| 6,430,737 B1 * | 8/2002 | Cobb et al. | 716/52 |
| 2007/0006118 A1 * | 1/2007 | Pierrat et al. | 716/21 |
| 2008/0178140 A1 | 7/2008 | Lin et al. | |
| 2009/0307649 A1 * | 12/2009 | Pramanik et al. | 716/19 |

\* cited by examiner

*Primary Examiner* — Vuthe Siek
*Assistant Examiner* — Eric Lee
(74) *Attorney, Agent, or Firm* — Haynes and Boone, LLP

(57) ABSTRACT

A method of an integrated circuit (IC) design includes receiving an IC design layout. The IC design layout includes an IC feature with a first outer boundary and a first target points assigned to the first outer boundary. The method also includes generating a second outer boundary for the IC feature and moving all the first target points to the second outer boundary to form a modified IC design layout.

13 Claims, 4 Drawing Sheets

METHOD FOR PROXIMITY CORRECTION

BACKGROUND

The semiconductor integrated circuit (IC) industry has experienced exponential growth. Technological advances in IC design and materials have produced generations of ICs where each generation has scaled down to smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example an optical proximity correction (OPC) technique is implemented in a mask fabrication. OPC employs a lithographic model to predict contours of the patterns after the lithography process. Before applying a correction, edges of the patterns are dissected into small segments and a target point is defined for each segment. Usually, several iterations are needed in order to achieve a convergence between the edge positions and the target points. A resolution limitation in lithography introduces rounding corners in the contours. A difference between the target point and rounding corner contour causes an unstable correction convergence, which results in a failure of pattern fidelity correction. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
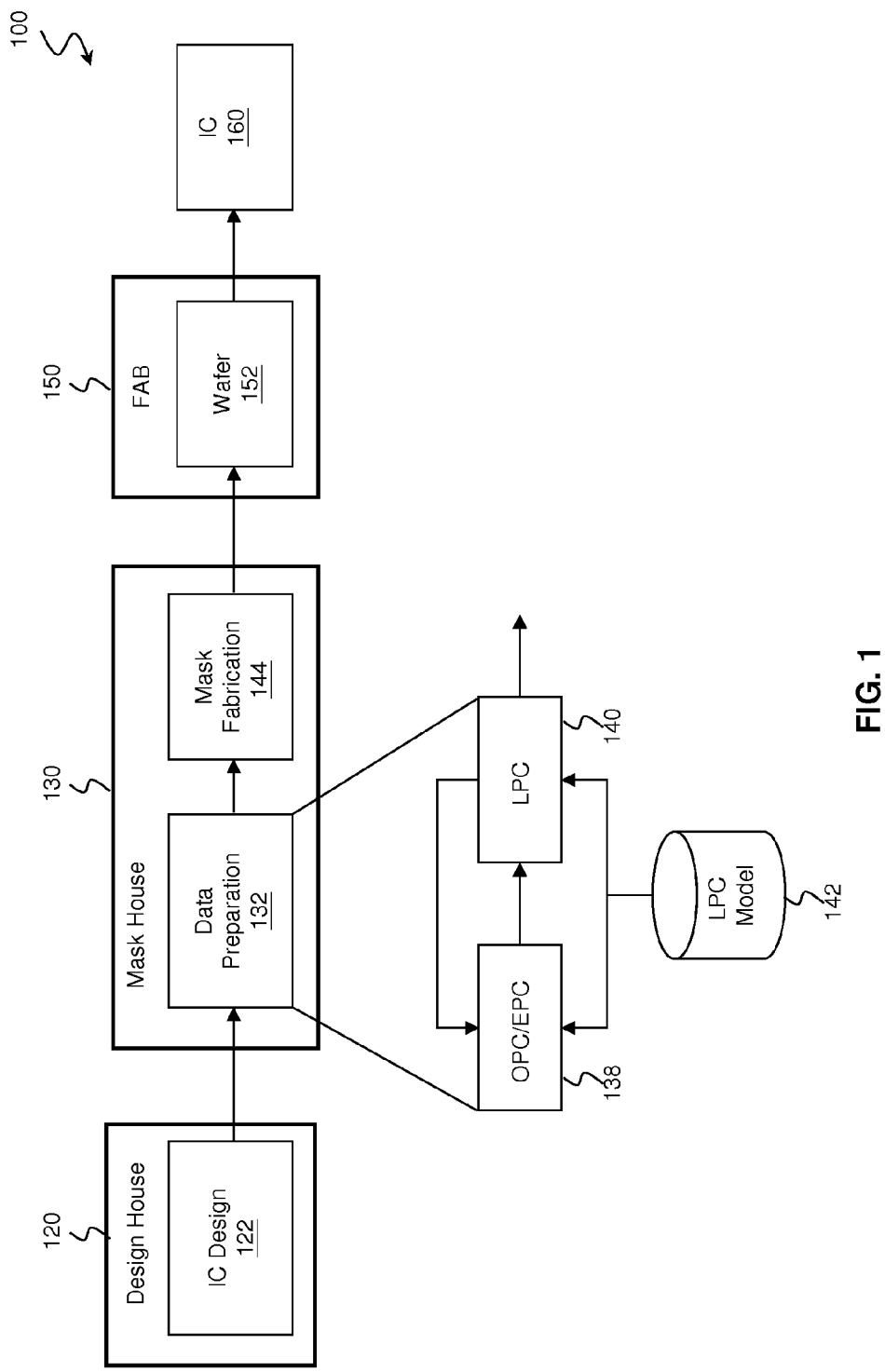
FIG. 1 is a simplified block diagram of an embodiment of an integrated circuit (IC) manufacturing system and an associated IC manufacturing flow.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer (fab) 150, that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and/or IC manufacturer 150 may together be parts of a larger corporate entity.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 includes an optical proximity correction (OPC) and/or an electron proximity correction (OPC/EPC) 138, and a lithography process check (LPC) 140. The OPC/EPC 138 is a lithography enhancement technique used to compensate for image errors, such as those that can arise from diffraction, interference, or other process effects. OPC/EPC 138 may add features, such as scattering bars, serif, and/or hammerheads to the IC design layout 122 according to optical models or rules such that, after a lithography process, a final pattern on a wafer is improved with enhanced resolution and precision. Optical proximity checking according to the illustrated embodiment will be described in greater detail below. The mask data preparation 132 can include further resolution enhancement techniques, such as off-axis illumination, sub-resolution assist features, phase-shifting masks, other suitable techniques, or combinations thereof.

The LPC 140 simulates processing that will be implemented by the IC manufacturer 150 to fabricate the IC device 160. The LPC 140 simulates this processing based on the IC design layout 122 to create a simulated manufactured device, such as the IC device 160. The simulated manufactured device includes simulated contours of all or a portion of the IC design layout. In the present embodiment, the LPC 140 simulates processing of the modified IC design layout, which has been subjected to the OPC /or EPC 138. The LPC 140 uses one or more LPC models (or rules) 142. The LPC models (or rules) 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

After a simulated device has been created by the LPC 140, if the simulated device is not close enough in shape to satisfy design rules, certain steps in the mask data preparation 132, such as OPC/EPC 138, may be repeated to refine the IC design layout 122 further. It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during data preparation 132 may be executed in a variety of different orders.

After mask data preparation 132 and during mask fabrication 144, a mask or group of masks are fabricated based on the modified IC design layout. For example, an electron-beam (e-beam) or a mechanism of multiple e-beams is used as an exposure source to form a pattern on a mask (photomask or reticle) based on the modified IC design layout. The IC manufacturer 150 uses the mask (or masks) fabricated by the mask house 130 to fabricate the IC device 160.

Figure 2:
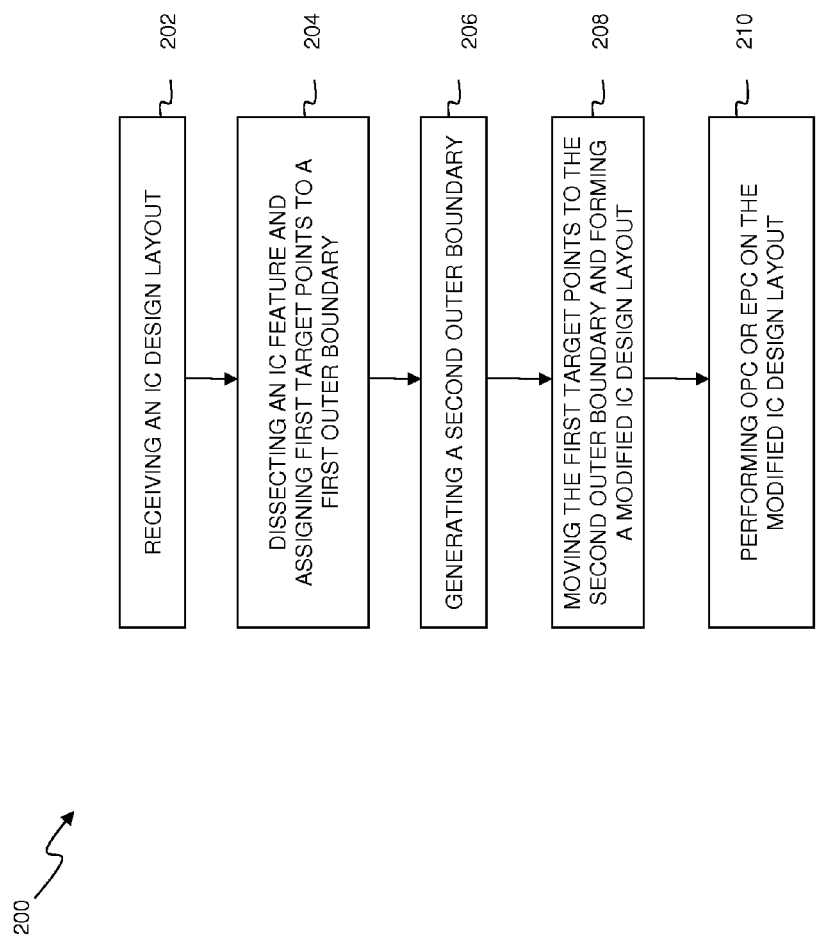
FIG. 2 is a flowchart of an example method of modifying an IC design layout before mask fabrication according to various aspects of the present disclosure.

FIG. 2 is a flowchart of a method 200 of modifying an IC design layout before mask fabrication according to various aspects of the present disclosure. In one embodiment, the method 200 may be implemented in the mask data preparation 132 of mask house 130 shown in FIG. 1. Further, the method 200 in FIG. 2 is an overview and details associated with each step in the method will be described in association with the subsequent figures in the present disclosure.

Figure 3:
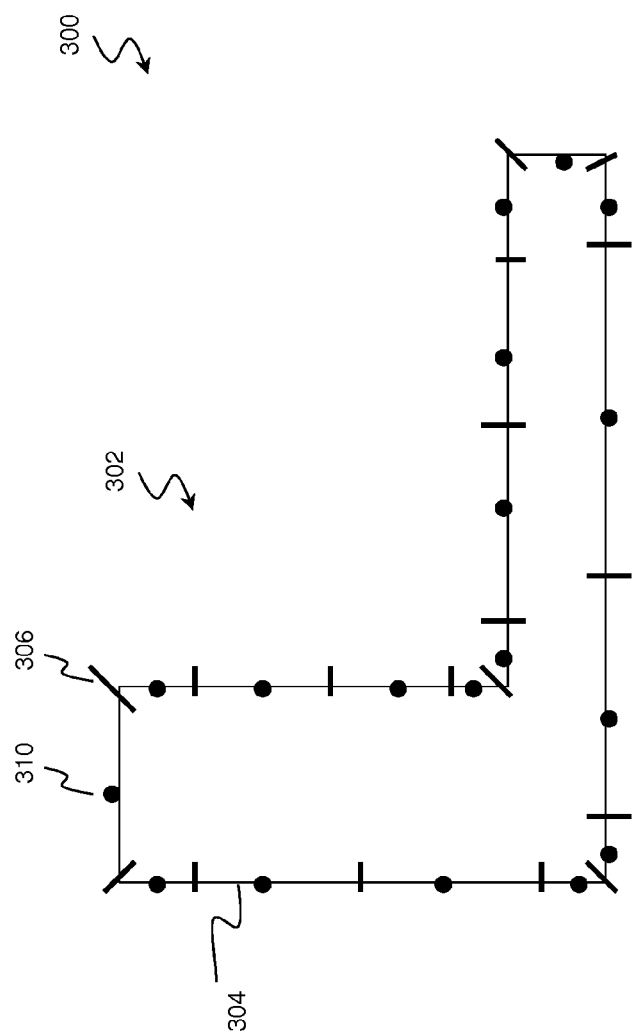
FIG. 3 is an example dissection performed on an IC feature.

Referring to FIGS. 2 and 3, the method 200 begins at step 202 by receiving an IC design layout 300. The IC design layout 300 is presented in one or more data files having the information of the geometrical patterns. In one example, the IC design layout 300 is expressed in a "GDS" format known in the art. In alternative embodiments, the IC design layout 300 may be transmitted between the components in IC manufacturing system 100 in alternate file formats such as DFII, CIF, OASIS, or any other suitable file type. The IC design layout 300 includes various geometrical patterns representing features of an integrated circuit. For example, the IC design layout 300 may includes main IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout 300 may also include certain assist features, such as those features for imaging effect, processing enhancement, and/or mask identification information.

In this regard, FIG. 3 illustrates an example IC feature 302 that is a feature contained in the IC design layout 300. In one embodiment, the IC feature 302 is a gate electrode, but, in alternative embodiments, it may be a interconnection feature or any other IC feature. The IC feature 302 has an original outer boundary 304 (referred to as a first outer boundary) that defines the shape of the IC feature 302. Ideally, when the IC feature 302 is formed on the integrated circuit 160, it will maintain the same shape as defined by the first outer boundary 304, but this is not always so.

The method 200 proceeds to step 204 by dissecting the IC feature 302 and assigning first target points 310 to the first outer boundary 304. The first outer boundary 304 is dissected into multiple discrete segments by a plurality of dissection points (or stitching points) 306. A segment is a portion of the first outer boundary 304 defined by two adjacent dissection points 306. Next, the first target points 310 are assigned to the first outer boundary 304. The first target points 310 are utilized in conjunction with the photolithography simulation of the IC feature 302 during LPC 140. Specifically, the first target points 310 are used to determine if the contours of the simulated feature match the first outer boundary 304. A greater or fewer number of the first target points 310 may be assigned to the first outer boundary 304 depending on an error tolerance of the final integrated circuit. Further, as shown in FIG. 3, each segment is associated with a single first target points 310.

Figure 4:
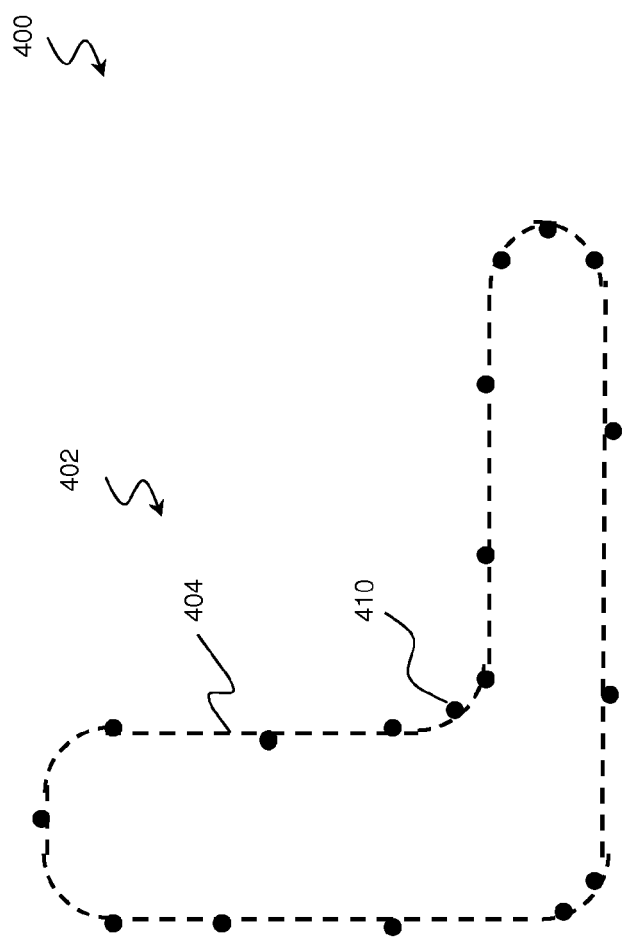
FIG. 4 is an example of an IC feature after it has undergone optical proximity correction.

Referring to FIGS. 2-4, the method 200 proceeds to step 206 by generating a second outer boundary 404 for the IC feature 302. In the present embodiment, the second outer boundary 404 contains one or more rounding corners. The second outer boundary 404 is generated by employing a convolution of the IC design layout 300 with a predetermined function. Briefly, a convolution is a mathematical algorithm applied on two functions $F_1$ and $F_2$ to generate a third function $F_3$ to show the amount of overlap of one of two functions as it is shifted over by another function. In one embodiment, the exposure system is an optical system with a wavelength ($\lambda$). The resolution blur size $\sigma$ can be calculated by $(k_1 \times \lambda/NA)$, where $k_1$ is a constant, $\lambda$ is the wavelength of photon, and NA is the numerical aperture of the exposure system. The predetermined function includes a Sinc function in a form of $[\sin^2(x/\sigma)/(x/\sigma)^2] \times [\sin^2(y/\sigma)/(y/\sigma)^2]$, where $\sigma$ is resolution blur size of an exposure system. In another embodiment, the exposure system is a charged-particle beam writer. The predetermined function includes a Gaussian function in a form of $\exp[-x^2/(2\sigma_x^2) - y^2/(2\sigma_y^2)]$, where $\sigma_x$ and $\sigma_y$ is resolution blur size of an exposure system in x direction and y direction, respectively The method 200 proceeds to step 208 by moving all the first target points 310 from the first outer boundary 304 to the second outer boundary 404 and generating a modified IC design layout 400 containing a modified IC feature 402. The first target points 310 are moved inward and outward to the second outer boundary 404. For example, the first target points 310 are moved along a direction, which is perpendicular to its original location in the first outer boundary 304. After moving to the second outer boundary, the target points 310 is referred to as a second target points 410 for the sake of clarity. The modified IC design layout 400 contains the modified IC feature 402 having the second outer boundary 404 with the second target points 410 on it and will be used in subsequent pattern correction processes.

The method 200 proceeds to step 210 by performing a proximity correction on the modified IC design layout 400. In one embodiment, the proximity correction includes an optical proximity correction (OPC). In general, the OPC is utilized to modify the shape of an IC feature to compensate for diffraction or other process effects so that the shape of the feature as formed in the final integrated circuit closely matches the shape of the feature in the IC design layout. As an example, the OPC may add various assist features, such as scattering bars, serifs or hammerheads to the modified IC feature 402. The assist features may be placed a distance away from the main feature (such as scattering bars) or be placed adjacent to the main feature (such as serifs and hammerheads).

In another embodiment, the proximity correction includes an electron proximity correction (EPC). An EPC is a compensation process for critical dimensions due to the electron scattering from the wafer substrate. The EPC process may include size bias correction, shape correction, dose correction and background dose equalization (GHOST) correction.

The method 200 further includes performing a photolithography simulation and an error evaluation on the modified IC design layout 400 to define a final IC design layout to be used in the mask fabrication 144.

Based on the above, it can be seen that the present disclosure offers a method for modifying the original IC design layout. The method has demonstrated to achieve a stable convergence of pattern fidelity in the layout shape correction or dosage correction.

The present disclosure provides many different embodiments of fabricating a semiconductor IC that provide one or more improvements over the prior art. In one embodiment, a method for an integrated circuit (IC) design includes receiving an IC design layout. The IC design layout includes an IC feature with a first outer boundary and first target points assigned to the first outer boundary. The method also includes generating a second outer boundary for the IC feature, moving all the first target points to the second outer boundary to form a modified IC design layout.

In another embodiment, a method for an integrated circuit (IC) design method includes receiving an IC design layout having an IC feature with a first outer boundary, assigning first target points to the first outer boundary, applying a convolution on the IC design layout with a predetermined function to generate a second outer boundary of the IC feature, moving all the first target points to the second outer boundary to form a modified IC design layout, performing a proximity correction and a photolithography simulation on the modified IC design layout.

In yet another embodiment, a method for an integrated circuit (IC) design method includes receiving an IC design layout having an IC feature with a first outer boundary and first target points on the first outer boundary, generating a second outer boundary of the IC feature by applying a convolution on the IC design layout with a predetermined function, wherein the second outer boundary containing one or more rounding corners, moving all the first target points to the second outer boundary to form a modified IC design layout, performing a proximity correction and a photolithography simulation on the modified IC design layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a mask for an integrated circuit (IC) design, the method comprising:
   receiving an IC design layout, the IC design layout including:
      an IC feature with a first outer boundary, and
      first target points assigned to the first outer boundary;
   generating, using a computing system, a second outer boundary for the IC feature;
   moving all the first target points to the second outer boundary to form a modified IC design layout; and
   providing the modified IC design layout for fabrication of the mask,
   wherein the second outer boundary is generated by applying convolution of the IC design layout with a predetermined function, and
   wherein the predetermined function includes a Sinc function in a form of $[\sin^2(x/\sigma)/(x/\sigma)^2] \times [\sin^2(y/\sigma)/(y/\sigma)^2]$, where x and y are positions in an x direction and a y direction, respectively, and $\sigma$ is a resolution blur size of an exposure system.

2. The method of claim 1, wherein the exposure system includes a photon exposure system with a wavelength ($\lambda$).

3. The method of claim 1, wherein the resolution blur size is calculated by $(k_1 \times \lambda/NA)$, where $k_1$ is a constant, $\lambda$ is a wavelength of a photon, and NA is a numerical aperture of the photon exposure system.

4. The method of claim 1, wherein the second outer boundary contains one or more rounding corners.

5. The method of claim 1, wherein the first target points are moved to the second outer boundary in a perpendicular direction to the first outer boundary.

6. The method of claim 1, wherein after moving the first target points to the second outer boundary and forming the modified IC design layout and before providing the modified IC design layout for fabrication, the method further comprising:
   performing optical proximity correction (OPC) on the modified IC design layout.

7. The method of claim 1, wherein after moving the first target points to the second outer boundary and forming the modified IC design layout and before providing the modified IC design layout for fabrication, the method further comprising:
   performing electron proximity correction (EPC) on the modified IC design layout.

8. The method of claim 1, further comprising:
   performing a photolithography simulation on the modified IC design layout; and
   performing an error evaluation on the modified IC design layout.

9. A method for making a mask for an integrated circuit (IC) design layout, the method comprising:
   receiving the IC design layout having an IC feature with a first outer boundary;
   assigning first target points to the first outer boundary;

applying, using a computer, a convolution on the IC design layout with a predetermined function to generate a second outer boundary of the IC feature;

moving the first target points to the second outer boundary to form a modified IC design layout;

performing a proximity correction on the modified IC design layout; and performing a photolithography simulation on the modified IC design layout, wherein the predetermined function includes a Gaussian function employed in a form of where $\exp[-x^2/(2\sigma_x^2)-y^2/(2\sigma_y^2)]$, where x and y are positions in an x direction and a y direction, respectively, and $\sigma_x$ and $\sigma_y$ is a resolution blur size of an exposure system in the x direction and the y direction, respectively.

10. The method of claim 9, wherein the exposure system includes a charged-particle exposure system.

11. The method of claim 9, wherein the second outer boundary contains one or more rounding corners.

12. A method comprising:

receiving a design layout having a feature, wherein the feature has a first boundary;

assigning a target point to the first boundary;

using a computing system, performing a photolithographic simulation on the design layout to determine a second boundary for the feature, wherein the photolithographic simulation includes performing a mathematical convolution of the design layout with an equation modeling a photolithographic blur of a photolithographic exposure system;

relocating the target point based on the second boundary of the feature; and providing the design layout having the relocated target point for performing a proximity correction thereupon, wherein the equation includes at least one of: a Sinc function in a form of $[\sin^2(x/\sigma)/(x/\sigma)^2] \times [\sin^2(y/\sigma)/(y/\sigma)^2]$, where x and y are positions in an x direction and a y direction, respectively, and $\sigma$ is a resolution blur size of an exposure system, and a Gaussian function employed in a form of $\exp[-x^2/(2\sigma_x^2)-y^2/(2\sigma_y^2)]$, where x and y are positions in an x direction and a y direction, respectively, and $\sigma_x$ and $\sigma_y$ are a resolution blur size of an exposure system in the x direction and the y direction, respectively.

13. The method of claim 12, wherein the assigning of the target point to the first boundary of the feature includes assigning a number of target points to the feature based on an error tolerance.

* * * * *